(12) United States Patent
Baggett

(10) Patent No.: US 11,901,198 B2
(45) Date of Patent: Feb. 13, 2024

(54) TOXIC OUTGAS CONTROL POST PROCESS

(71) Applicant: Axcelis Technologies, Inc., Beverly, MA (US)

(72) Inventor: John F. Baggett, Amesbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 743 days.

(21) Appl. No.: 16/509,915

(22) Filed: Jul. 12, 2019

(65) Prior Publication Data

US 2021/0013061 A1 Jan. 14, 2021

(51) Int. Cl.
*H01L 21/06* (2006.01)
*H01J 37/317* (2006.01)
*H01L 21/67* (2006.01)

(52) U.S. Cl.
CPC .... *H01L 21/67098* (2013.01); *H01J 37/3171* (2013.01); *H01L 21/67248* (2013.01); *H01J 2237/002* (2013.01)

(58) Field of Classification Search
None
See application file for complete search history.

(56) References Cited

U.S. PATENT DOCUMENTS

| | | | | |
|---|---|---|---|---|
| 4,605,469 A * | 8/1986 | Shih | ........................ | C30B 23/02 414/217 |
| 4,909,314 A * | 3/1990 | Lamont, Jr. | ....... | H01L 21/67098 204/192.12 |
| 6,222,196 B1 * | 4/2001 | Mack | ....................... | H01J 37/20 250/442.11 |
| 7,615,745 B2 * | 11/2009 | Schampers | ............ | G01N 1/286 250/442.11 |
| 9,481,943 B2 * | 11/2016 | Arena | .................. | C23C 16/4412 |
| 2006/0131514 A1 * | 6/2006 | Anc | ....................... | H01J 37/165 250/492.21 |

(Continued)

FOREIGN PATENT DOCUMENTS

WO   WO-2017152958 A1 *   9/2017   ........... F27D 5/0037

OTHER PUBLICATIONS

International Search Report and Written Opinion dated Sep. 30, 2020 in connection with International Application No. PCT/US2020/041386.

*Primary Examiner* — Sylvia MacArthur
(74) *Attorney, Agent, or Firm* — Eschweiler & Potashnik, LLC (57) ABSTRACT

A workpiece processing system has a cooling chamber enclosing a chamber volume. A workpiece support within the cooling chamber supports a workpiece having a material with an outgassing temperature, above which, the material outgases an outgas material at an outgassing rate that is toxic to personnel. A cooling apparatus selectively cools the workpiece to a predetermined temperature. A vacuum source and purge gas source selectively evacuates and selectively provides a purge gas to the chamber volume. A controller controls the cooling apparatus to cool the workpiece to the predetermined temperature, where the one or more materials are cooled below the outgassing temperature. The vacuum source and purge gas source are controlled to provide a predetermined heat transfer rate while removing the respective outgas material from the chamber volume.

14 Claims, 4 Drawing Sheets

(56) References Cited

U.S. PATENT DOCUMENTS

| | | | |
|---|---|---|---|
| 2008/0102646 A1* | 5/2008 | Kawaguchi | H01L 21/02071 |
| | | | 438/725 |
| 2008/0144251 A1* | 6/2008 | Tao | H01L 21/6833 |
| | | | 361/234 |
| 2010/0171044 A1 | 7/2010 | Lee | |
| 2011/0265887 A1* | 11/2011 | Lee | H01L 21/67017 |
| | | | 137/561 R |
| 2013/0248014 A1 | 9/2013 | Kobayashi | |
| 2014/0034846 A1 | 2/2014 | Lee | |
| 2014/0038962 A1* | 2/2014 | Padmanabhan | C07D 413/12 |
| | | | 514/342 |
| 2015/0228515 A1* | 8/2015 | Lee | F28D 1/06 |
| | | | 165/80.1 |
| 2018/0033659 A1* | 2/2018 | Yan | B08B 15/00 |
| 2018/0082874 A1 | 3/2018 | Bao | |
| 2021/0013061 A1* | 1/2021 | Baggett | H01L 21/67248 |

* cited by examiner

TOXIC OUTGAS CONTROL POST PROCESS

FIELD

The present disclosure relates generally to workpiece processing systems and methods for processing workpieces, and more specifically to a system, apparatus, and method for mitigating outgas materials in a chamber having a thermal chuck.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 100-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a dedicated high temperature electrostatic chuck (ESC), also called a heated chuck. The heated chuck holds or clamps the workpiece to a surface thereof during implantation. A conventional high temperature ESC, for example, comprises a set of heaters embedded under the clamping surface for heating the ESC and workpiece to the process temperature (e.g., 100° C.-600° C.), whereby a gas interface conventionally provides a thermal interface from the clamping surface to the backside of the workpiece. Typically, a high temperature ESC is cooled through radiation of energy to the chamber surfaces in the background.

SUMMARY

The present disclosure appreciates that during ion implantation into a workpiece, especially during a heated ion implantation, various films previously formed on the workpiece can outgas. Further, absent countermeasures, when the workpiece is implanted with environmentally toxic species in an ion implantation system, such outgassing can pose safety concerns for personnel upon removal of the workpiece from the ion implantation system. In order to maintain a safe environment for the personnel, the workpiece should be at a stable temperature and stable outgassing rate upon removal from the ion implantation system. However, achieving such a stable temperature and outgassing rate can limit a selection of species that are permitted to be implanted at higher temperatures, or otherwise cause delays in processing of the workpiece.

The outgassing rate, for example, is generally affected by one or more of temperature and pressure. In general, as the temperature of the workpiece increases, outgassing increases. Further, as a pressure to which the workpiece is exposed decreases, outgassing can likely generally increase. The total amount of material outgassed, and the rate of outgassing is generally difficult to calculate, as it is impacted by many variables. While not generally considered a substantial issue for implants performed at room temperatures, outgassing increases with higher temperature, heated implants. As such, cooling of the workpiece is performed as quickly as possible in a post-cool station; however, but by the time the workpiece is sufficiently cooled, a significant amount of outgassing has already occurred.

Accordingly, the present disclosure overcomes limitations of the prior art by providing a system, apparatus, and method for mitigating outgassing of materials associated with heating of a workpiece in a chamber. Various aspects of the present disclosure provide advantages over conventional systems and methods, with particular advantages being provided in heated ion implantation systems utilizing a thermal chuck. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

In accordance with one exemplified aspect of the disclosure, a workpiece processing system is provided, wherein a cooling chamber generally encloses a chamber volume. A workpiece support is positioned within the cooling chamber and configured to selectively support a workpiece having one or more materials residing thereon. Each of the one or more materials, for example, has a respective outgassing temperature associated therewith, above which, the one or more materials outgas a respective outgas material at a respective outgassing rate that is toxic to personnel.

A cooling apparatus, for example, is provided and configured to selectively cool the workpiece to a predetermined temperature. The workpiece support, for example, may comprise a cold plate having one or more cooling channels defined therein, wherein the cooling apparatus comprises a coolant source configured to selectively flow a cooling fluid through the one or more cooling channels of the cold plate.

A vacuum source, for example, is configured to selectively evacuate the chamber volume, while a purge gas source is configured to selectively provide a purge gas to the chamber volume. In one example, a vacuum valve is configured to provide selective fluid communication between the vacuum source and a vacuum port in the cooling chamber, and a purge gas valve is configured to provide selective fluid communication between the purge gas source and a purge gas port in the cooling chamber. The vacuum valve and purge gas valve, for example, are configured to selectively flow the purge gas from the purge gas port to the vacuum port.

A controller is further provided, wherein in one example, the controller is configured to cool the workpiece to the predetermined temperature via a control of the cooling apparatus, thereby cooling the one or more materials to below the respective outgassing temperature. The controller is further configured to control the vacuum source and purge gas source, for example, to provide a predetermined pressure associated with a predetermined heat transfer rate within the chamber volume concurrent with cooling of the workpiece, while further removing the respective outgas material from the chamber volume.

In another example, a first loadlock valve is operably coupled to the cooling chamber and configured to provide selective fluid communication between the chamber volume and a first environment. The first loadlock valve, for example, is further configured to selectively pass the workpiece between the chamber volume and the first environment. Likewise, a second loadlock valve may be operably coupled to the cooling chamber and configured to provide selective fluid communication between the chamber volume and a second environment. The second loadlock valve, for example, is further configured to selectively pass the workpiece between the chamber volume and second environment.

The controller, for example, is thus further configured to selectively open and close the first loadlock valve and second loadlock valve, thereby selectively isolating the chamber volume from the first environment and second environment, respectively. In one example, the controller is further configured to selectively control the vacuum valve and purge gas valve to selectively flow the purge gas from the purge gas port to the vacuum port at the predetermined pressure concurrent with cooling of the workpiece, thereby generally evacuating the outgassed material from the chamber volume and preventing a release of the outgassed material to the first environment. The controller may be configured, for example, to selectively open and close the purge gas valve and vacuum valve to selectively evacuate the chamber volume and/or provide the predetermined pressure within the chamber volume either concurrently, or in a sequential manner.

The first environment may comprise an atmospheric environment at atmospheric pressure, while the second environment may comprise a vacuum environment at a vacuum pressure, whereby the controller is configured to flow the purge gas from the purge gas port to the vacuum port concurrent with the second loadlock valve isolating the chamber volume from the second environment.

In accordance with another example, a scrubber is operably coupled to the vacuum source, wherein the vacuum source is configured to selectively transfer the outgas material from the chamber volume to the scrubber. The scrubber, for example, is configured to remove one or more toxic gases from the respective outgas materials for safe environmental disposal, thereof.

A temperature measurement apparatus, for example, may be further provided and configured to determine a measured temperature of the workpiece, wherein the controller is further configured to control the vacuum source and purge gas source based, at least in part, on the measured temperature of the workpiece.

In accordance with another exemplified aspect of the disclosure, a post-processing cooling apparatus is provided, wherein a load lock chamber generally encloses a chamber volume. The chamber comprises a vacuum port, a vacuum valve, a purge gas port, and a purge gas valve, for example, wherein the vacuum port is in fluid communication with the chamber volume and the vacuum valve, and wherein the purge gas port is in fluid communication with chamber volume and the purge gas valve. For example, a vacuum source in fluid communication with the vacuum valve, and a purge gas source in fluid communication with the purge gas valve.

A workpiece support is positioned within the load lock chamber, for example, and configured to selectively support a workpiece having one or more materials residing thereon. Each of the one or more materials, for example, has a respective outgassing temperature associated therewith, above which, the one or more materials outgas a respective outgas material at a respective outgassing rate that is toxic to personnel.

The workpiece support, for example, comprises a cold plate having one or more cooling channels defined therein. A cooling apparatus may be further associated with the workpiece support, wherein the cooling apparatus is configured to selectively flow a cooling fluid through the one or more cooling channels of the cold plate.

A controller, for example, may be further provided and configured to cool the workpiece to the predetermined temperature via a control of the cooling apparatus, thereby cooling the one or more materials to below the respective outgassing temperature. The controller may be further configured to control the vacuum valve and purge gas valve to provide a predetermined pressure associated with a predetermined heat transfer rate within the chamber volume concurrent with cooling of the workpiece, while further removing the respective outgas material from the chamber volume. The controller may be configured selectively evacuate the chamber volume and provide the predetermined pressure within the chamber volume in a sequential manner, and/or to concurrently evacuate the chamber volume and provide the predetermined pressure within the chamber volume.

In accordance with yet another exemplified aspect of the disclosure, a method for mitigating a toxic outgassing of a workpiece is provided. The method, for example, comprises heating the workpiece above an outgassing temperature in a process chamber, wherein above the outgassing temperature, a material residing on the workpiece outgasses an outgas material at an outgassing rate that is toxic to personnel. The workpiece, for example, is then transferred to a cooling chamber, wherein the cooling chamber is selectively isolated from the process chamber and an external environment. The workpiece is further cooled within the chamber volume to below the outgassing temperature.

In one example, the chamber volume is selectively evacuated concurrent with cooling of the workpiece, thereby removing the outgas material from the chamber volume. In another example, a predetermined pressure associated with a predetermined heat transfer rate is provided within the chamber volume concurrent with cooling of the workpiece. For example, selectively evacuating the chamber volume and providing the predetermined pressure within the chamber volume is performed in a sequential manner. In another example, selectively evacuating the chamber volume and providing the predetermined pressure within the chamber volume is performed concurrently.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

The present disclosure is directed generally toward semiconductor processing systems and methods, and more particularly, to a chamber for an ion implantation system, wherein the chamber is configured to control a temperature of a workpiece. The chamber, for example, comprises a loadlock chamber having a ventilation control system configured to mitigate of outgassed materials from the workpiece concurrent with a cooling of the workpiece.

Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

Heated workpiece processing, such as seen in heated ion implantation processes, can heat a workpiece to process temperatures in the range of 100° C.-600° C. or higher. During an implantation of various species into workpieces, especially during heated ion implantations of toxic species into workpieces having various materials previously formed or deposited thereon, outgassing associated with the various materials can lead to environmentally toxic vapors being emitted from the workpiece that, absent countermeasures, can pose safety concerns for personnel upon removal of the workpiece from the ion implantation system. The present disclosure provides a safe environment for personnel, whereby toxic outgassed materials are mitigated and the workpiece is provided at a stable temperature and stable outgassing rate upon removal from the ion implantation system. The safe environment is further provided without limiting a selection of species for implantation at high process temperatures or presenting substantial delays in processing of the workpiece.

Figure 1:
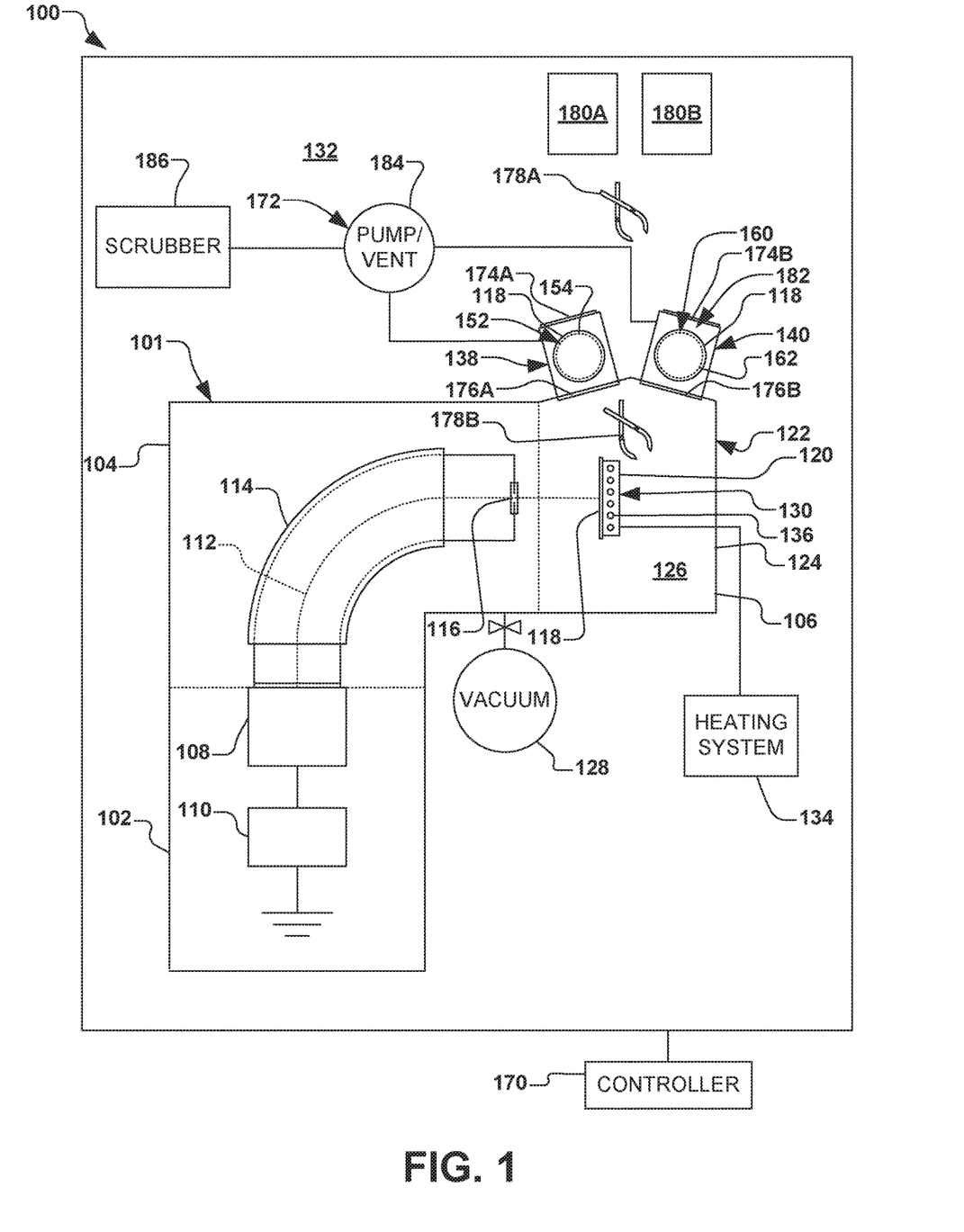
FIG. 1 illustrates a block diagram of an exemplified heated ion implantation system in accordance with an aspect of the present disclosure.

Accordingly, the present disclosure provides a system, apparatus, and method for mitigating outgassing of materials associated with heating of a workpiece in a chamber associated with ion implantation. In order to gain a better understanding of the invention and in accordance with various aspects of the present disclosure, FIG. 1 illustrates an exemplified ion implantation system 100. The ion implantation system 100 in the present example comprises an exemplified ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a thermal chuck 120. The thermal chuck 120, for example, may comprise an electrostatic chuck (ESC) or mechanical clamp chuck, wherein the thermal chuck is configured to selectively control a temperature of the workpiece 118. Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplified aspect, the end station 106 comprises a process chamber 122, such as a vacuum chamber 124, wherein a process environment 126 is associated with the process chamber. The process environment 126 (e.g., a high vacuum environment) generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 100-600° C. or greater). Thus, in the present example, the thermal chuck 120 comprises a heated chuck 130, wherein the heated chuck is configured to support and retain the workpiece 118 while further heating the workpiece 118 within the process chamber 122 prior to, during, and/or after the exposure of the workpiece to the ion beam 112.

The heated chuck 130, for example, comprises an electrostatic chuck (ESC) configured to heat the workpiece 118 to a processing temperature that is considerably greater than an ambient or atmospheric temperature of the surroundings or external environment 132 (e.g., also called an "atmospheric environment"). A heating system 134 may be further provided, wherein the heating system is configured to heat the heated chuck 130 and, in turn, the workpiece 118 residing thereon to the desired processing temperature. The heating system 134, for example, is configured to selectively heat the workpiece 118 via one or more heaters 136 disposed within the heated chuck 130. In one alternative, the heating system 134 comprises a radiant heat source, such as one or more a halogen lamp, light emitting diode, and infrared thermal device configured to selectively heat the workpiece.

For some high temperature implants, the workpiece 118 may allowed to "soak" on the heated chuck 130 within the vacuum of the process environment 126 until the desired temperature is reached. Alternatively, in order to increase cycle time through the ion implantation system 100 the workpiece 118 may be pre-heated in a pre-heat chamber 138 (e.g., a load lock chamber) operatively coupled to the process chamber 122. Similarly, the workpiece 118 may be cooled post-processing in a cooling chamber 140 (e.g., a load lock chamber) in order to cool the workpiece in a predetermined manner.

Depending on the tool architecture, process, and desired throughput, the workpiece 118 may be preheated to the first temperature via a pre-heat apparatus 152 (e.g., disposed within the pre-heat chamber 138). In one example, the first temperature is equal to or lower than the process temperature, thus allowing for a final thermal equalization on the heated chuck 130 inside the vacuum chamber 124. Such a scenario allows the workpiece 118 to lose some heat during transfer to the process chamber 122, wherein final heating to the process temperature is performed on the heated chuck 130. Alternatively, the workpiece 118 may be preheated via the pre-heat apparatus 152 to the first temperature, wherein the first temperature is higher than the process temperature. Accordingly, the first temperature could be optimized such that cooling of the workpiece 118 during transfer to the process chamber 122 allows for the workpiece to be at the desired process temperature as it is clamped onto the heated chuck 130.

In order to accurately control and/or accelerate the thermal response and enable an additional mechanism for heat transfer, the back side of the workpiece 118 is brought into conductive communication with the heated chuck 130. This conductive communication is achieved through a pressure controlled gas interface (also called "back side gas") between the heated chuck 130 and the workpiece 118. Pressure of the back side gas, for example, is generally limited by the electrostatic force of the heated chuck 130, and can be generally kept in the range of 5-20 Torr. In one example, the back side gas interface thickness (e.g., the distance between the workpiece 118 and the heated chuck 130) is controlled on the order of microns (typically 5-20 µm), and as such, the molecular mean free path in this pressure regime becomes large enough for the interface thickness to push the system into the transitional and molecular gas regime.

In accordance with another aspect of the disclosure, cooling chamber 140 comprises a cooling apparatus 160 configured to cool the workpiece when the workpiece 118 is disposed within the cooling chamber subsequent to being implanted with ions during ion implantation or being subject to other processing. The cooling apparatus 160, for example, may comprise a chilled workpiece support 162, wherein the chilled workpiece support is configured to actively cool the workpiece 118 residing thereon via thermal conduction. The chilled workpiece support 162, for example, comprises a cold plate having a one or more cooling channels passing therethrough, wherein a cooling fluid passing through the cooling channel substantially cools the workpiece 118 residing on a surface of the cold plate. The chilled workpiece support 162 may comprise other cooling mechanisms, such as Peltier coolers or other cooling mechanisms known to one of ordinary skill.

In accordance with another exemplified aspect, a controller 170 is further provided and configured to selectively activate one or more of the heating system 134, the pre-heat apparatus 152, and the cooling apparatus to selectively heat or cool the workpiece 118 respectively residing thereon. The controller 170, for example, may be configured to heat the workpiece 118 in pre-heat chamber 138 via the pre-heat apparatus 152, to heat the workpiece to a predetermined temperature in the processing chamber 122 via the heated chuck 130 and heating system 134, to implant ions into the workpiece via the ion implantation apparatus 101, to cool the workpiece in cooling chamber 140 via the cooling apparatus 160, and to selectively transfer the workpiece between the atmospheric environment 132 and the vacuum environment 126 via control of a pump and vent 172, the respective atmospheric doors 174A, 1748 and vacuum doors 176A, 1768 of the respective preheat chamber 138 and cooling chamber 140, and workpiece transfer apparatus 178A, 178B.

In one example, the workpiece 118 may be further delivered to and from the process chamber 122 such that the workpiece is transferred between a selected front opening unified pod (FOUP) 180A, 180B and respective preheat chamber 138 and cooling chamber 140 via workpiece transfer apparatus 178A, and further transferred between the respective preheat chamber and cooling chamber and the heated chuck 130 via workpiece transfer apparatus 1788. The controller 170, for example, is further configured to selectively transfer the workpiece between the FOUPs 180A, 180B, respective preheat chamber 138 and cooling chamber 140, and heated chuck 130 via a control of the workpiece transfer apparatus 178A, 178B.

The present disclosure appreciates that, prior to be delivered to the process chamber 122, for example, the workpiece 118 may have undergone previous processing, whereby the workpiece may comprise one or more materials (e.g., photoresist layers or other materials) that may have been deposited or otherwise formed on the workpiece. During heating of the workpiece 118 by the pre-heat apparatus 152 in the preheat chamber 138, or by the heated chuck 130 in the process chamber 122, for example, outgassing may occur, whereby the materials formed, deposited, or otherwise residing on the workpiece may transform from a solid state to various gases. Further, processing of the workpiece 118 in the process chamber 122 (e.g., ion implantation, deposition of materials, etc.) can further lead to outgassing of materials implanted and/or deposited on the workpiece within the process chamber. In some instances, such as when the ion beam 112 comprises an environmentally toxic species, and/or when the materials formed, deposited, or otherwise residing on the workpiece 118 comprise environmentally toxic materials, the outgassing may yield environmentally toxic gases. For example, in a high temperature implantation of an environmentally toxic material such an arsenic, the arsenic could potentially outgas, based on the temperature, pressure, and dose associated with the implantation. Higher doses, for example, lead to higher concentrations of the material being implanted, thus leading a greater amount of material available to outgas.

In one example, after completion of the desired processing (e.g., ion implantation) in the process chamber 122, the workpiece 118 is removed from the high vacuum environment 126 of the process chamber, whereby the workpiece is at an elevated temperature associated with the process temperature. For example, the workpiece 118 may be transferred from the high vacuum environment 126 of the process chamber 122 to a chamber environment 182 of the cooling chamber 140 for cooling after processing. In one example, the chamber environment 182 is at a lower pressure than the high vacuum environment 126, such as atmospheric pressure, whereby heat transfer is substantially increased to promote expeditious cooling of the workpiece 118. However, since the workpiece 118 is initially at the elevated temperature associated with the process temperature when placed in the chamber environment 182, outgassing can occur from the materials on the workpiece. Such outgassing, if exhausted to the external environment 132, could have a potential of being dangerous to personnel, or activating alarms alerting personnel or other equipment of a hazardous situation.

This present disclosure thus advantageously provides an apparatus and system for controlling the release of outgassed materials. For example, the pump and vent 172 of the present disclosure comprises a rough pump 184 configured to evacuate the outgassed materials and processes the outgassed materials through a toxic material scrubber 186. The scrubber 186, for example, is configured to remove one or more toxic gases from the respective outgassed materials.

In accordance with one example, the cooling chamber 140 is configured to be pumped down by the rough pump 184 in order to aid in removing the outgassed materials from the workpiece 118, such as concurrent with cooling of the workpiece via the cooling apparatus 160. This pump down via the rough pump 184, for example, can be a single, continuous pump down until the outgassing rate is below a predetermined rate that is satisfactory for safety of personnel. While the present disclosure decreases an outgassing rate, the present disclosure appreciates that one or more of time, temperature and pressure can be used as a proxy for determining when the termination of the pumping sequence can be completed. For example, if an outgassing rate of a material is known to be minimal at room temperature, then the pump down routine can be performed until the workpiece reaches room temperature. For example, an amount of time may be known for a workpiece to reach room temperature from an elevated temperature (e.g., a workpiece takes n seconds to reach room temperature for a known elevated temperature). Alternatively, a temperature sensor may be utilized to determine the temperature of the workpiece for termination of the pumping sequence. In another alternative, a plurality of vent and pump cycles can be performed in a predetermined or otherwise controlled sequence via the pump and vent 172.

Once the workpiece 118 is cooled to a predetermined temperature, for example, a final pump down can be performed via the rough pump 184 to substantially remove any further toxins from the chamber environment 182, whereby the workpiece can be safely removed from the cooling chamber 140 into the external environment 132.

Figure 2:
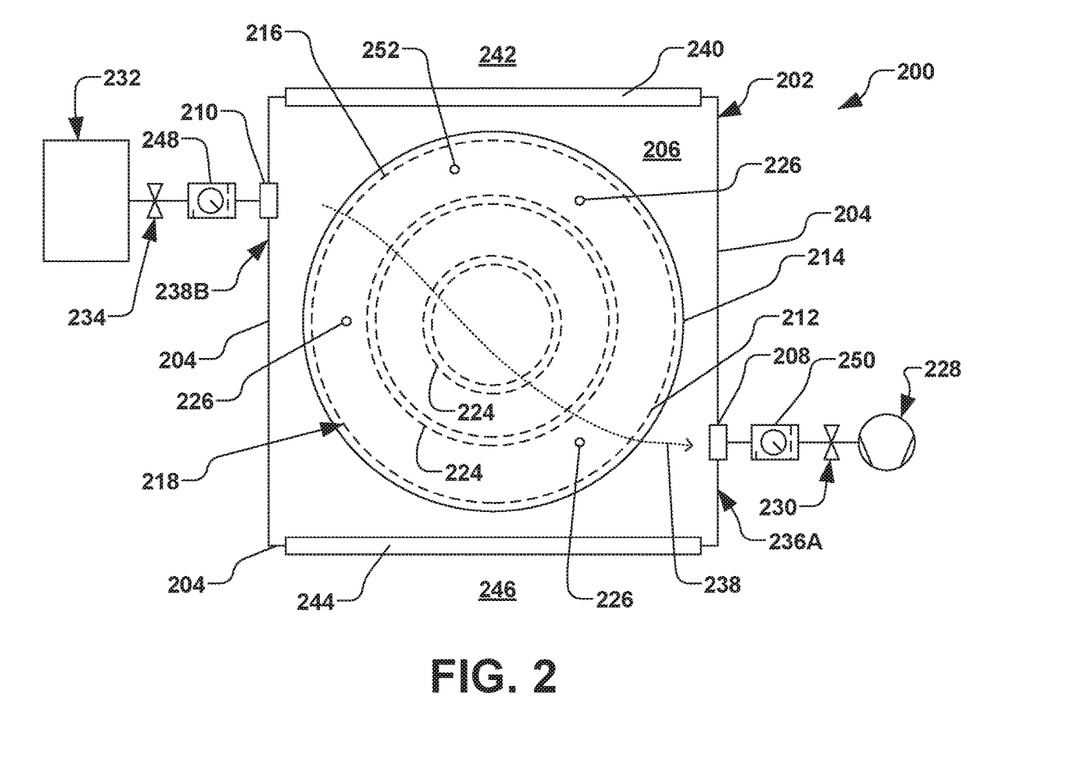
FIG. 2 is a schematic representation of an exemplified chamber in accordance with an aspect of the present disclosure.

As illustrated in FIG. 2, for example, a loadlock apparatus 200 is provided, wherein a cooling chamber 202, such as the cooling chamber 140 of FIG. 1, is provided. The cooling chamber 202 of FIG. 2, for example, has one or more chamber walls 204 generally enclosing a chamber volume 206. The cooling chamber 202, for example, comprises a vacuum port 208 and a purge gas port 210, wherein the vacuum port and purge gas port are in fluid communication with the chamber volume 206.

Figure 3:
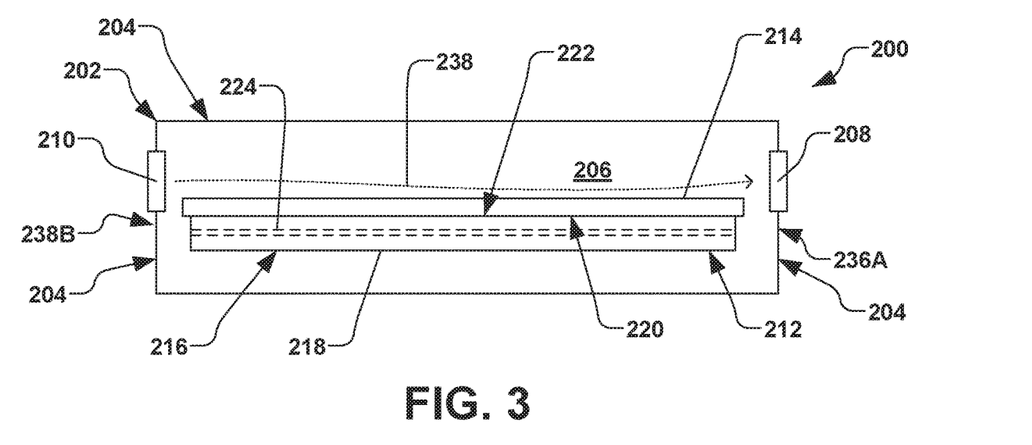
FIG. 3 is a simplified side view of a chamber in accordance with an aspect of the present disclosure.

According to one example, a workpiece support 212 is positioned within the cooling chamber 202 and configured to selectively support a workpiece 214 within the chamber. A cooling apparatus 216, for example, is further provided and configured to selectively chill or cool the workpiece 214 to a predetermined temperature. In one example, the workpiece support 212 comprises a chilled platen 218 having a support surface 220 configured to contact a backside 222 of the workpiece 214, as illustrated in FIG. 3. In one example, the chilled platen 218 generally defines the cooling apparatus 216. For example, the cooling apparatus 216 may comprise one or more cooling channels 224 embedded within the chilled platen 218, wherein the one or more cooling channels are configured to selectively cool the workpiece 214 via conduction of heat to a fluid (e.g. water) flowed therethrough. In other examples, the cooling apparatus 216 may alternatively, or additionally comprise one or more cooling elements (not shown), such as a Peltier cooler, radiative fins, or other element configured to cool the workpiece 214. In another example, the workpiece support 212 may comprise one or more pins 226, as illustrated in FIG. 2, whereby the one or more pins are configured to selectively raise and lower the workpiece 214 onto the support surface 220.

In accordance with the present disclosure, concurrent with the cooling the workpiece 214, an outgassed material (not shown) may be emitted or outgassed from the workpiece within the chamber volume 206, as described above. Accordingly, the present disclosure advantageously provides a vacuum source 228 (e.g., a vacuum pump such as the rough pump 184 of FIG. 1), wherein a vacuum valve 230 is configured to provide selective fluid communication between the vacuum source and the vacuum port 208. Further, in accordance with another example, a purge gas source 232 having a purge gas (e.g., an inert gas such as nitrogen) is further provided, whereby a purge gas valve 234 is configured to provide selective fluid communication between the purge gas source and the purge gas port 210.

In accordance with one example, the controller (e.g., the controller 170 of FIG. 1) is further configured to control the vacuum valve 230 and purge gas valve 234 to selectively flow the purge gas from the purge gas port 210 to the vacuum port 208 at a predetermined pressure concurrent with cooling of the workpiece 214 by the cooling apparatus 216. Accordingly, outgassed material associated with previous heating of the workpiece 214 (and any materials disposed thereon) may be advantageously evacuated from the chamber volume 206, thus generally preventing exposure of personnel to toxic materials associated with the outgassed material. Preferably, the vacuum port 208 and purge gas port 210 are generally positioned opposite one another with respect to the chamber 202, such as being positioned on opposing chamber walls 236A, 236B, whereby a flow (shown by arrow 238) generally passes over the workpiece 214, thus advantageously evacuating outgassed materials through the vacuum port 208.

In one example, the cooling chamber 202 is generally evacuated by the vacuum source 228 while the purge gas is concurrently introduced into the chamber from the purge gas source 232 wherein a predetermined pressure is advantageously maintained within the chamber volume 206. For example, the predetermined pressure is approximately atmospheric pressure, whereby an advantageous heat transfer can be achieved for post-cooling of the workpiece 214, such as after a heated ion implantation described above, thus providing adequate throughput of workpieces. Further, the introduction of the purge gas concurrent with the evacuation of the cooling chamber 202 generally dilutes and substantially evacuates outgassed material from the chamber volume 206, thus diluting and removing the outgassed material from the chamber volume and generally preventing exposure of personnel to toxic materials.

According to another example, as illustrated in FIG. 2, the cooling chamber 202 comprises a first loadlock valve 240 operably coupled to the cooling chamber and configured to provide selective fluid communication between the chamber volume 206 and a first environment 242, such as the atmospheric environment or external environment 132 of FIG. 1. The first loadlock valve 240 of FIG. 2, for example, is further configured to selectively pass the workpiece 214 between the chamber volume 206 and the first environment 242, as discussed above. A second loadlock valve 244, for example, is further operably coupled to the cooling chamber 202 and configured to provide selective fluid communication between the chamber volume 206 and a second environment 246 (e.g., a high vacuum environment such as the process environment 126 of FIG. 1). The second loadlock valve 244 of FIG. 2, for example, is further configured to selectively pass the workpiece 214 between the chamber volume 206 and second environment 246.

The controller 170 of FIG. 1, for example, is further configured to selectively open and close the first loadlock valve 240 of FIG. 2, thereby selectively isolating the chamber volume 206 from the first environment 242. In a further example, the controller 170 of FIG. 1 is further configured to selectively open and close the second loadlock valve 244, thereby selectively isolating the chamber volume 206 from the second environment 246. The controller 170 of FIG. 1, for example, may be further configured to flow the purge gas from the purge gas port 210 of FIG. 2 to the vacuum port 208 concurrent with one or more of the second loadlock valve 244 isolating the chamber volume 206 from the second environment 246 and the first loadlock valve 240 isolating the chamber volume from the first environment 242. The controller 170 of FIG. 1 may be further configured open the purge gas valve 234 and vacuum valve 230 of FIG. 2 concurrent with the cooling of the workpiece 214 by the cooling apparatus 216, thereby further concurrently flowing the purge gas from the purge gas port 210 to the vacuum port 208 at the predetermined pressure.

In accordance with another example, the purge gas valve 234 may further comprise a purge gas regulator 248. Additionally, or optionally, the vacuum valve 230 may further comprise a vacuum regulator 250. As such, the purge gas regulator 248 and vacuum regulator 250, for example, may be configured to provide the predetermined pressure when the purge gas is flowed from the purge gas port 210 to the vacuum port 208. In accordance with another example, the controller 170 of FIG. 1 may be further configured to control one or more of the purge gas regulator 248 and vacuum regulator 250 of FIG. 2, thereby controlling the predetermined pressure. Alternatively, one or more of the purge gas regulator 248 and vacuum regulator 250 may comprise manual regulators, whereby the pressure associated therewith may be manually controlled.

In accordance with yet another example, a temperature measurement apparatus 252 may be provided and configured to determine or define a measured temperature of the workpiece 214. Accordingly, the controller 170 of FIG. 1 may be further configured to control the vacuum valve 230 and purge gas valve 234 of FIG. 2 based, at least in part, on the measured temperature of the workpiece 214. In one example, a workpiece 214 that is initially at a process temperature (e.g., 200C-600C) is placed in the cooling chamber 202, whereby the workpiece is cooled within the chamber until the measured temperature matches a desired safe temperature (e.g., approximately 50-C or other temperature deemed to be safe for personnel. In yet another example, the controller 170 of FIG. 1 is further configured to control the vacuum valve 230 and purge gas valve 234 based, at least in part, on a predetermined time, during which the workpiece 214 is cooled by the cooling apparatus 216.

Accordingly, the present disclosure advantageously provides an efficient solution to mitigating toxic outgassed material associated with the heating of the workpiece 214 concurrent with cooling the workpiece from a heated process, such as high temperature ion implantation. For example, during the predetermined time (e.g., 10 seconds), the workpiece 214 is cooled and the outgassed materials are generally diluted with the purge gas and evacuated from the cooling chamber 202 via a vacuum pressure provided by the vacuum source 228 (e.g., a rough pump). The scrubber 186 of FIG. 1, for example, may further environmentally clean or process the outgassed material for safe release into the environment.

In accordance with one example, the vacuum source 228 of FIG. 2 may be cycled on and off, and the purge gas valve 234 may be cycled on and off to continuously cycle the pump-down. For example, the vacuum source 228 pumps down to rough vacuum, then the purge gas valve 234 vents purge gas into the cooling chamber 202, then the vacuum source pumps down again to rough vacuum, and so on, such that substantially all toxic outgassed material is removed from the cooling chamber.

Another example comprises maintaining the vacuum valve 230 open, thus continuously pumping from the cooling chamber 202, and opening and closing the purge gas valve 234 and bleeding in a purge gas (e.g., nitrogen) to maintain substantially atmospheric pressure within the cooling chamber concurrent with the cooling of the workpiece 214. As such, a control of the purge gas pressure and flow is provided to maintain a generally atmospheric condition within the cooling chamber 202, thus providing substantial heat transfer within the cooling chamber while continuously pulling vacuum with the vacuum source 228. As such, the vacuum source 227 (e.g., a rough vacuum) substantially removes any toxic outgassed material post-implant while advantageously maintaining the atmospheric condition for efficient heat transfer for cooling of the workpiece 214.

The present disclosure thus provides for the workpiece 118 of FIG. 1 to be removed from the system 100 in a safe condition, whereby any toxic material that may have outgassed due to the elevated temperatures associated with the heated ion implantation is removed or otherwise mitigated. Accordingly, the present disclosure provides an additional pump and sequence of pumping, such that before the atmospheric door 1748 (e.g., the first loadlock valve 240 of FIG. 2) is opened to the external environment 132 (e.g., atmosphere), the cooling chamber 140 is pumped down then vented to evacuate outgasses during the cooldown cycle. The present disclosure further contemplates such a pumping and venting being performed once or multiple times, based on a desired cleanliness or lack of contaminants in the gases removed.

In accordance with another example, the scrubber apparatus 186 is configured to remove toxins from the outgassed material. For example, the scrubber apparatus 186 is operably coupled to the cooling chamber 140, whereby the rough pump 184 transfers the outgassed material through the scrubber apparatus. The scrubber apparatus 186, for example, is configured to clean the gases removed from the cooling chamber 140 and removes toxins from the gases.

Accordingly, the present disclosure provides an expeditious reduction in the temperature of the workpiece 118 post-implant, such that the workpiece is quickly brought to a safe temperature for handling prior to being placed back in the FOUP 180A, 180B, while also mitigating toxic materials associated with outgassing.

Figure 4:
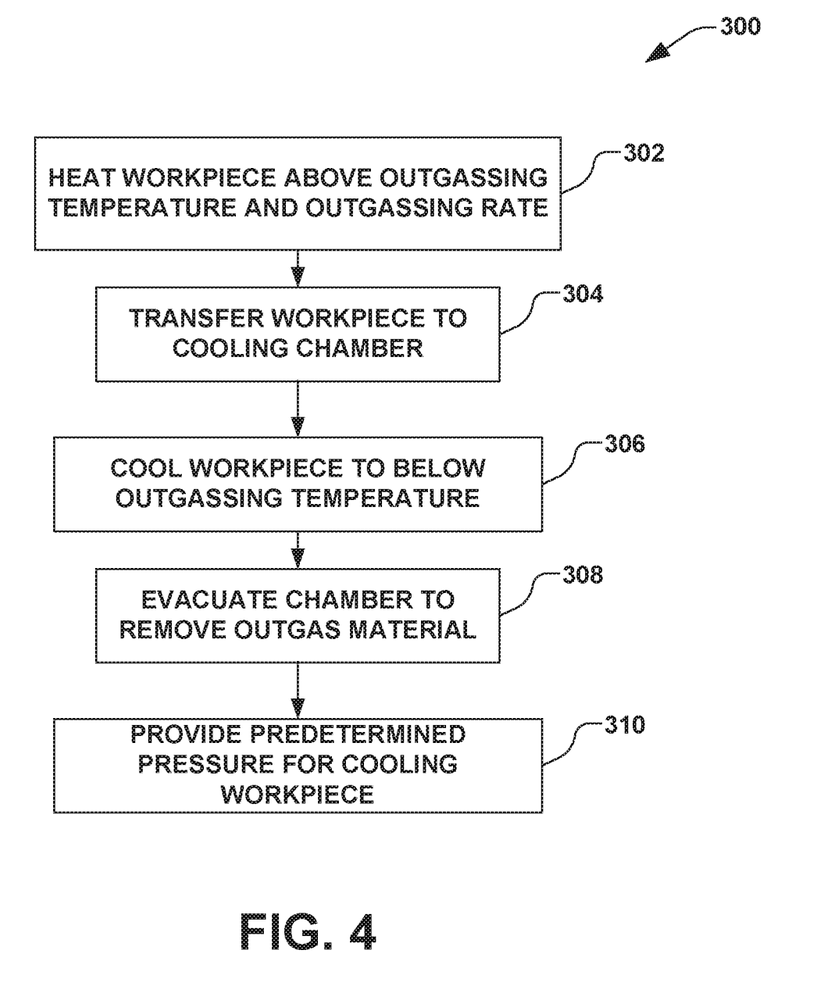
FIG. 4 is a block diagram illustrating an exemplified method for mitigating toxic outgassed materials according to another exemplified aspect of the disclosure.

In another aspect of the disclosure, FIG. 4 illustrates a method 300 for mitigating a toxic outgassed material associated with a high temperature processing of a workpiece. It should be noted that while exemplified methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 shown in FIG. 4, for example, begins with heating the workpiece above an outgassing temperature in a process chamber in act 302, wherein above the outgassing temperature, a material residing on the workpiece outgasses an outgas material at an outgassing rate that is toxic to personnel. In act 304, the workpiece is transferred to a cooling chamber, wherein a chamber volume of the cooling chamber is selectively isolated from the process chamber and an external environment. The workpiece, for example, is placed on a cooling platen in the cooling chamber in act 304, whereby the cooling platen actively cools the workpiece via a flow of a cooling fluid therethrough.

In act 306, the workpiece is cooled within the chamber volume to below the outgassing temperature. Further, in act 308, the chamber volume is selectively evacuated concurrent with cooling of the workpiece in act 306, thereby removing the outgas material from the chamber volume. In act 310, a predetermined pressure associated with a predetermined heat transfer rate within the chamber volume is further attained concurrent with cooling of the workpiece in act 306.

In accordance with one example, selectively evacuating the chamber volume in act 308 and providing the predetermined pressure within the chamber volume in act 310 are performed in a sequential manner. For example, acts 308 and 310 may be performed sequentially one or more times until a temperature of the workpiece is below the outgassing temperature.

In accordance with another example, selectively evacuating the chamber volume in act 308 and providing the predetermined pressure within the chamber volume in act 310 are performed concurrently. For example, acts 308 and 310 may be performed at substantially the same time, such that the outgassed material is evacuated in act 308 while maintaining a pressure within the chamber volume in act 310 to provide acceptable heat transfer from the workpiece to the cooling platen.

Figure 5:
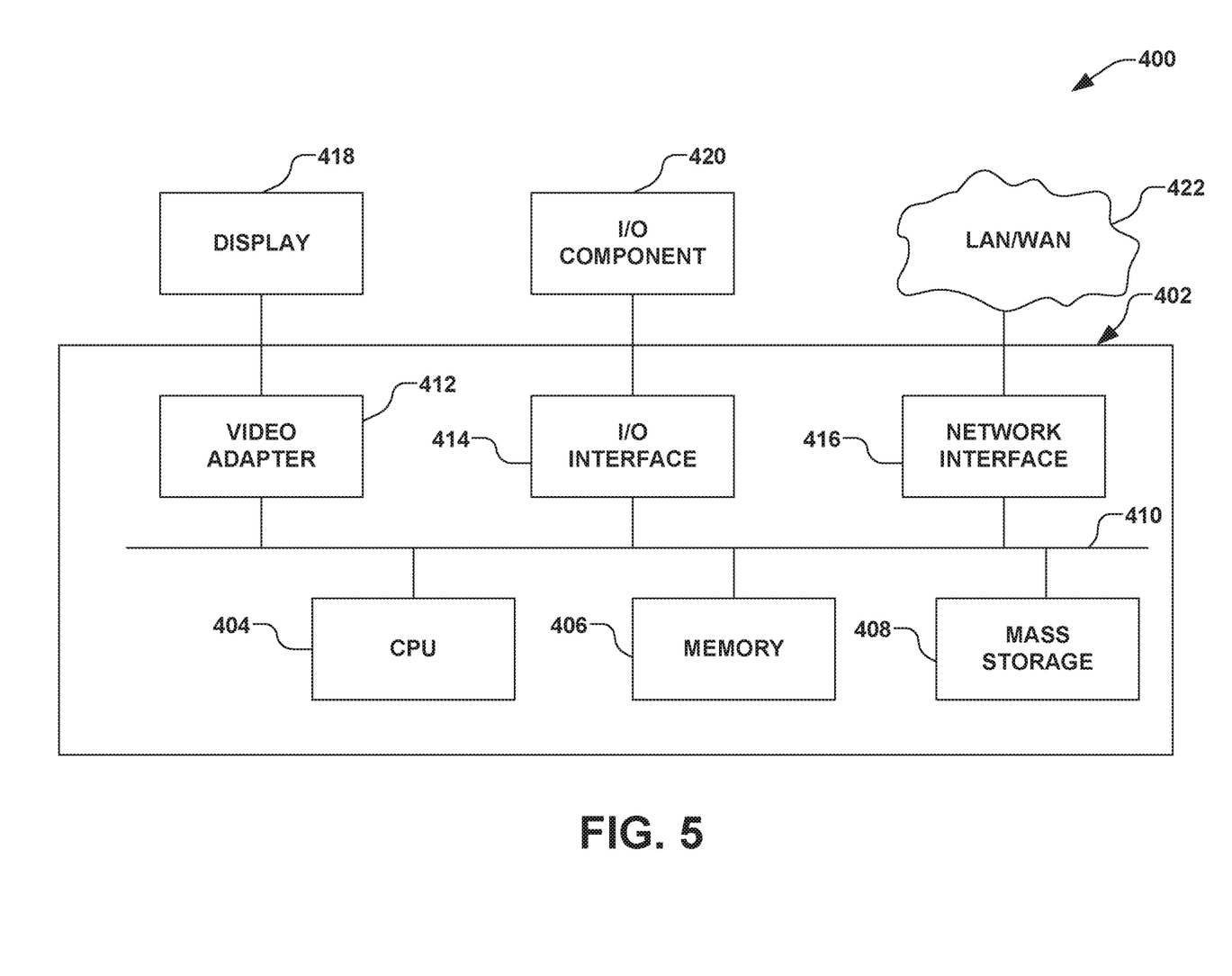
FIG. 5 is a block diagram illustrating an exemplified control system in accordance with another aspect.

In accordance with another aspect, the aforementioned methodology may be implemented using computer program code in one or more of a controller, general purpose computer, or processor based system. As illustrated in FIG. 5, a block diagram is provided of a processor based system 400 in accordance with another embodiment. The processor based system 400 is a general purpose computer platform and may be used to implement processes discussed herein. The processor based system 400 may include a processing unit 402, such as a desktop computer, a workstation, a laptop computer, or a dedicated unit customized for a particular application. The processor based system 400 may be equipped with a display 418 and one or more input/output devices 420, such as a mouse, a keyboard, or printer. The processing unit 402 may include a central processing unit (CPU) 404, memory 406, a mass storage device 408, a video adapter 412, and an I/O interface 414 connected to a bus 410.

The bus 410 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 408 may include any type of storage device configured to store data, programs, and other information and to make the data, programs, and other information accessible via the bus 410. The mass storage device 308 may include, for example, one or more of a hard disk drive, a magnetic disk drive, or an optical disk drive.

The video adapter 412 and the I/O interface 414 provide interfaces to couple external input and output devices to the processing unit 402. Examples of input and output devices include the display 418 coupled to the video adapter 412 and the I/O device 420, such as a mouse, keyboard, printer, and the like, coupled to the I/O interface 414. Other devices may be coupled to the processing unit 402, and additional or fewer interface cards may be utilized. For example, a serial interface card (not shown) may be used to provide a serial interface for a printer. The processing unit 402 also may include a network interface 416 that may be a wired link to a local area network (LAN) or a wide area network (WAN) 422 and/or a wireless link.

It should be noted that the processor based system 400 may include other components. For example, the processor based system 400 may include power supplies, cables, a motherboard, removable storage media, cases, and the like. These other components, although not shown, are considered part of the processor based system 400.

Embodiments of the present disclosure may be implemented on the processor based system 400, such as by program code executed by the CPU 404. Various methods according to the above-described embodiments may be implemented by program code. Accordingly, explicit discussion herein is omitted.

Further, it should be noted that various modules and devices in FIGS. 1-6 may be implemented on and controlled by one or more processor based systems 400 of FIG. 7. Communication between the different modules and devices may vary depending upon how the modules are implemented. If the modules are implemented on one processor based system 400, data may be saved in memory 406 or mass storage 408 between the execution of program code for different steps by the CPU 404. The data may then be provided by the CPU 404 accessing the memory 406 or mass storage 408 via bus 410 during the execution of a respective step. If modules are implemented on different processor based systems 400 or if data is to be provided from another storage system, such as a separate database, data can be provided between the systems 400 through I/O interface 414 or network interface 416. Similarly, data provided by the devices or stages may be input into one or more processor based system 300 by the I/O interface 414 or network interface 416. A person having ordinary skill in the art will readily understand other variations and modifications in implementing systems and methods that are contemplated within the scope of varying embodiments.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplified embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece processing system, comprising:
a cooling chamber generally enclosing a chamber volume;
a workpiece having one or more materials residing thereon, wherein each of the one or more materials has a respective outgassing temperature associated therewith, above which, the one or more materials outgas a respective outgas material at a respective outgassing rate that is toxic to personnel;
a cooling apparatus comprising a chilled workpiece support positioned within the cooling chamber and configured to selectively support the workpiece, wherein the chilled workpiece support has a support surface configured to selectively contact a backside of the workpiece, wherein the cooling apparatus is configured to selectively cool the workpiece to a predetermined temperature via thermal conduction between the support surface and the workpiece;
a vacuum source configured to selectively evacuate the chamber volume;
a purge gas source configured to selectively provide a purge gas to the chamber volume; and
a controller configured to cool the workpiece to the predetermined temperature via a control of the cooling apparatus, thereby cooling the one or more materials to below the respective outgassing temperature, and wherein the controller is further configured to control the vacuum source and purge gas source to provide a predetermined pressure associated with a predetermined heat transfer rate within the chamber volume concurrent with cooling of the workpiece, while further removing the respective outgas material from the chamber volume.

2. The workpiece processing system of claim 1, wherein the predetermined temperature is determined based on a respective outgassing curve associated with the one or more materials.

3. The workpiece processing system of claim 1, further comprising a scrubber operably coupled to the vacuum source, wherein the vacuum source is configured to selectively transfer the respective outgas material from the chamber volume to the scrubber, and wherein the scrubber is configured to remove one or more toxic gases from the respective outgas material.

4. The workpiece processing system of claim 1, wherein the chilled workpiece support comprises a cold plate having one or more cooling channels defined therein, and wherein the cooling apparatus comprises a coolant source configured to selectively flow a cooling fluid through the one or more cooling channels of the cold plate.

5. The workpiece processing system of claim 1, further comprising:
a first loadlock valve operably coupled to the cooling chamber and configured to provide selective fluid communication between the chamber volume and a first environment, and wherein the first loadlock valve is further configured to selectively pass the workpiece between the chamber volume and the first environment; and
a second loadlock valve operably coupled to the cooling chamber and configured to provide selective fluid communication between the chamber volume and a second environment, and wherein the second loadlock valve is further configured to selectively pass the workpiece between the chamber volume and second environment.

6. The workpiece processing system of claim 5, wherein the controller is further configured to selectively open and close the first loadlock valve, thereby selectively isolating the chamber volume from the first environment, and wherein the controller is further configured to selectively open and close the second loadlock valve, thereby selectively isolating the chamber volume from the second environment.

7. The workpiece processing system of claim 6, wherein the cooling chamber comprises a vacuum port and a purge gas port in fluid communication with the chamber volume, the workpiece processing system further comprising:
a vacuum valve configured to provide selective fluid communication between the vacuum source and the vacuum port; and
a purge gas valve configured to provide selective fluid communication between the purge gas source and the purge gas port, wherein the vacuum valve and purge gas valve are configured to selectively flow the purge gas from the purge gas port to the vacuum port, and wherein the controller is further configured to control the vacuum valve and the purge gas valve to selectively flow the purge gas from the purge gas port to the vacuum port at the predetermined pressure concurrent with cooling of the workpiece, thereby generally evacuating the respective outgas material from the chamber volume and preventing a release of the respective outgas material to the first environment.

8. The workpiece processing system of claim 7, wherein the first environment comprises an atmospheric environment at atmospheric pressure, and wherein the second environment comprises a vacuum environment at a vacuum pressure.

9. The workpiece processing system of claim 8, wherein the controller is configured to flow the purge gas from the purge gas port to the vacuum port concurrent with the second loadlock valve isolating the chamber volume from the second environment and the first loadlock valve isolating the chamber volume from the first environment.

10. The workpiece processing system of claim 7, wherein the controller is configured to open the purge gas valve and the vacuum valve concurrent with the cooling of the workpiece, thereby further concurrently flowing the purge gas from the purge gas port to the vacuum port at the predetermined pressure.

11. The workpiece processing system of claim 10, wherein the purge gas valve comprises a purge gas regulator, and wherein the vacuum valve comprises a vacuum regulator, wherein the purge gas regulator and vacuum regulator are configured to provide the predetermined pressure when the purge gas is flowed from the purge gas port to the vacuum port.

12. The workpiece processing system of claim 11, wherein the controller is configured selectively open and close the purge gas valve and the vacuum valve to selectively evacuate the chamber volume and provide the predetermined pressure within the chamber volume in a sequential manner.

13. The workpiece processing system of claim 11, wherein the controller is configured to selectively concurrently evacuate the chamber volume and provide the predetermined pressure within the chamber volume.

14. The workpiece processing system of claim 1, further comprising a temperature measurement apparatus configured to determine a measured temperature of the workpiece, wherein the controller is further configured to control the vacuum source and the purge gas source based, at least in part, on the measured temperature of the workpiece.

\* \* \* \* \*